United States Patent
Hermes et al.

(10) Patent No.: US 8,912,532 B2
(45) Date of Patent: Dec. 16, 2014

(54) PATTERNING THE EMISSION COLOUR IN TOP-EMISSIVE OLEDS

(75) Inventors: Dorothee Christine Hermes, Waalre (NL); Joanne Sarah Wilson, Dordrecht (NL); Petrus Alexander Rensing, Eindhoven (NL)

(73) Assignee: Nederlandse Organisatie voor toegepast-natuurwetenschappelijk onderzoek TNO, Delft (NL)

( * ) Notice: Subject to any disclaimer, the term of this patent is extended or adjusted under 35 U.S.C. 154(b) by 288 days.

(21) Appl. No.: 13/263,615

(22) PCT Filed: Apr. 7, 2010

(86) PCT No.: PCT/NL2010/050185
§ 371 (c)(1),
(2), (4) Date: Feb. 1, 2012

(87) PCT Pub. No.: WO2010/117272
PCT Pub. Date: Oct. 14, 2010

(65) Prior Publication Data
US 2012/0126252 A1    May 24, 2012

(30) Foreign Application Priority Data
Apr. 7, 2009 (EP) .................................. 09157519

(51) Int. Cl.
*H01L 29/08* (2006.01)
*H01L 51/52* (2006.01)
*H01L 27/32* (2006.01)

(52) U.S. Cl.
CPC ....... *H01L 51/5265* (2013.01); *H01L 2251/558* (2013.01); *H01L 51/529* (2013.01); *H01L 2251/5315* (2013.01); *H01L 27/3246* (2013.01)
USPC 257/40; 257/643; 257/E25.008; 257/E25.009; 257/E21.007; 257/E21.024; 438/22; 438/82; 438/99; 349/84; 349/146; 313/505

(58) Field of Classification Search
USPC .................... 257/40, 643, E25.008, E25.009, 257/E21.007, E21.024; 438/22, 82, 99; 349/84, 146; 313/504, 505
See application file for complete search history.

(56) References Cited

U.S. PATENT DOCUMENTS

| | | | |
|---|---|---|---|
| 5,780,174 | A | 7/1998 | Tokito et al. |
| 5,936,347 | A | 8/1999 | Isaka et al. |

(Continued)

FOREIGN PATENT DOCUMENTS

| | | |
|---|---|---|
| CN | 1947464 A | 4/2007 |
| CN | 101120447 A | 2/2008 |

(Continued)

OTHER PUBLICATIONS

International Search Report for PCT/NL2010/050185 dated Jul. 6, 2010.

*Primary Examiner* — Su Kim
(74) *Attorney, Agent, or Firm* — Banner & Witcoff, Ltd.

(57) ABSTRACT

The invention relates to a top-emissive organic light-emitting diode (OLED) (10) arranged to emit light having different emission colors, comprising a multi-layered structure provided with a first electrode, a second electrode and a functional layer enabling light emission disposed between the first electrode and the second electrode, wherein thickness (H1, H2) of the functional layer is modulated by allowing at least a portion of the functional layer to interact with a thickness modulator (5a, 5b, 5c), wherein the functional layer comprises a hole injection layer or the electron injection layer.

12 Claims, 3 Drawing Sheets

(56) References Cited

U.S. PATENT DOCUMENTS

| | | |
|---|---|---|
| 6,091,197 A | 7/2000 | Sun et al. |
| 6,326,224 B1 | 12/2001 | Xu et al. |
| 6,406,801 B1 | 6/2002 | Tokito et al. |
| 2005/0140273 A1 | 6/2005 | Guo et al. |
| 2005/0153468 A1 | 7/2005 | Gupta et al. |
| 2005/0156515 A1 | 7/2005 | Fukase |
| 2005/0269947 A1* | 12/2005 | Kobayashi .................. 313/504 |
| 2006/0066224 A1* | 3/2006 | Ito .............................. 313/504 |
| 2006/0108919 A1* | 5/2006 | Kobayashi .................. 313/506 |
| 2007/0052119 A1* | 3/2007 | Sakai et al. ................. 264/1.7 |
| 2007/0102737 A1 | 5/2007 | Kashiwabara et al. |
| 2007/0120474 A1 | 5/2007 | Kubota et al. |
| 2007/0228367 A1 | 10/2007 | Nakamura |
| 2007/0286944 A1* | 12/2007 | Yokoyama et al. .......... 427/66 |
| 2008/0024402 A1 | 1/2008 | Nishikawa et al. |
| 2008/0203903 A1 | 8/2008 | De Kok et al. |
| 2009/0039777 A1* | 2/2009 | Oda .............................. 313/504 |

FOREIGN PATENT DOCUMENTS

| | | |
|---|---|---|
| EP | 1 443 572 A2 | 8/2004 |
| JP | 11 288 786 A | 10/1999 |
| JP | 2002056973 A | 2/2002 |
| JP | 2005093401 A | 4/2005 |
| JP | 2005222928 A | 8/2005 |
| JP | 2005317255 A | 11/2005 |
| JP | 2006269251 A | 10/2006 |
| JP | 2007200905 A | 8/2007 |
| JP | 2008257938 A | 10/2008 |
| WO | 2006/009612 A1 | 1/2006 |
| WO | 2007/141702 A1 | 12/2007 |
| WO | 2008/030309 A1 | 3/2008 |

\* cited by examiner

PATTERNING THE EMISSION COLOUR IN TOP-EMISSIVE OLEDS

CROSS-REFERENCE TO RELATED APPLICATIONS

This application is a U.S. National Stage application under 35 U.S.C. §371 of International Application PCT/NL2010/050185 (published as WO 2011/117272 A2), filed Apr. 7, 2010, which claims priority to Application EP 09157519.1, filed Apr. 7, 2009. Benefit of the filing date of each of these prior applications is hereby claimed. Each of these prior applications is hereby incorporated by reference in its entirety.

FIELD

The invention relates to a top-emissive OLED arranged to emit light having different colours, comprising a multi-layered structure provided with a first electrode, a second electrode and a functional layer enabling light emission disposed between the first electrode and the second electrode.

The invention further relates to an electronic device comprising such an OLED.

The invention further relates to a method of manufacturing a top-emissive OLED.

BACKGROUND

An embodiment of an OLED capable of emitting light having different colours is known from WO 2006/087654. In the known OLED an anode layer is provided on a suitable substrate, which is followed by a hole-injection layer, for example a PEDOT:PSS material, followed by a layer of a light emissive material, having modulated thickness along the substrate, above which a cathode layer is deposited.

In the known OLED, for obtaining suitable thickness modulation of the light-emitting layer the light-emitting layer is deposited by a technique such as ink-jet printing.

It is a disadvantage of the known OLED that accuracy of thickness modulation of the light-emitting layer may be of inferior reproducibility due to possible process inconsistencies of the ink-jet printing. In addition, boundaries between regions having different thickness may not be of a suitable sharpness, due to the fact that patterning is carried out from a liquid phase causing liquid to assume an intermediate thickness between such adjacent regions due to surface tension.

SUMMARY OF THE INVENTION

It is an object of the invention to provide a top-emissive OLED capable of emitting light of different colours using a modulated functional layer, wherein such modulation is obtained with high accuracy and reproducibility, but is also achieved using a very simple and fast technique.

To this end in the top-emissive OLED according to the invention thickness of the functional layer is modulated by allowing at least a part of the functional layer to interact with a thickness modulator, wherein the said portion of the functional layer comprises a hole injection layer or an electron injection layer.

It will be appreciated that the diode according to the invention further comprises a light-emitting layer superposed on top of the hole injection layer or the electron injection layer. It will be further appreciated that the scale of the modulation achieved according to the invention is visible to the human eye (i.e. on a length scale that is of the order of 40 micrometers or greater)

For example, the thickness modulator may relate to a layer comprising a plurality of wells having different dimensions which is arranged directly beneath the functional layer. As a result, when a suitable material constituting a functional layer is to be deposited on the well profile, a different level of well filling is achieved for wells of different dimensions due to wetting properties. In this way, a reproducible and accurate thickness modulation of the functional layer may be achieved. It will be appreciated that the functional layer may comprise a layer of a light-emitting polymer (LEP) cooperating with a hole injection layer, such as PEDOT:PSS or PANI, and also possibly with an electron injection layer, such as TPBI, TAZ, OXD7, or the like. The technical measure of the invention is based on the insight that a per se known micro cavity effect, whereby the thickness of the functional layer in any region of the device will determine the emission colour from that particular region, may be used for enabling accurate colour modulation of the emission from the device over the entire device area.

It will further be understood that the term 'well' should not be construed as a limitation regarding a shape and/or two- or three-dimensional dimensions of such irregularity. In fact, the well may be regarded as a suitable region having pre-determined dimensions. Wells of different shapes, for example rectangular, spherical, cylindrical or conical are contemplated.

Alternatively, thickness modulation of the functional layer may be achieved during a process of drying of a layer forming part the functional layer, for example by allowing such layer to interact with a suitably shaped heating plate which may be arranged nearby such layer or in close contact with it. For example, when an H-shaped heating plate is arranged close to a suitable constitute of the functional layer, areas of the layer superposing the H-shape will be heated faster than adjacent areas. As a result such heated areas will have a different thickness to that of the adjacent areas, leading to a desired thickness modulation.

It will be appreciated that the shape, the temperature of the heater plate and duration of interaction with the functional layer may be selected in accordance with a desired effect. Such selection is considered to lie within the general knowledge of the skilled artisan.

It is found, that regarding a PEDOT layer thickness, a change from blue light emission to green light emission may be obtained by increasing the thickness of the PEDOT layer from 0 nm to 95 nm for the same thickness of a standard blue light-emitting polymer above the PEDOT layer. Therefore, the thickness modulators, as discussed with reference to the above are suitable for reproducibly achieving the desired colour modulation.

In an embodiment of the device according to the invention the plurality of wells is provided by a patterned photoresist.

It is found that photolithography provides a particularly suitable method for defining a desired plurality of wells having different lateral dimensions. For example a resist layer containing wells with dimensions from 240×240 $\mu m^2$ to 40×40 $\mu m^2$ could be achieved and is shown schematically in FIGS. 1a and 1b. It will be appreciated that other well dimensions are also possible. It will also be appreciated that the dimensions relate to a lateral dimension, i.e. a dimension parallel to a surface of a substrate supporting the multi-layer structure of the OLED (axes x and y in FIGS. 1a and 1b).

Due to the wetting properties of a liquid material, for example a material used for a hole injection layer, like PEDOT, individual wells having different dimensions along a surface of a layer will be filled to a different extent by the liquid material. It will be appreciated that the respective lateral dimensions of the wells may vary from the limit of the photolithography process (for example 1 μm) up to the whole surface area of the sample. As an example, for wells with an area of 240×240 μm² it has been possible to achieve green emission, while for wells with an area of 120×120 μm² or smaller it has been possible to achieve blue emission when using a light-emitting polymer which usually has blue emission in combination with a PEDOT layer.

In a further embodiment of the device according to the invention the plurality of regions with modified layer thicknesses is provided by a technique selectable from a group consisting of: application of patterned light to a photosensitive hole or electron injection layer material, surface pre-treatment, printing, coating, and drying.

It is found that techniques other than lithography may be applied for defining the regions with different layer thicknesses. It will be appreciated that photolithography is advantageous when a fine pattern of microscopic structures is to be provided, as photolithographic methods are generally capable of generating objects with well defined three-dimensional shapes. However, should tolerances of shaping the regions with different layer thicknesses be relaxed, the regions may be formed by techniques such as surface pre-treatment, printing, coating or drying. An example of the surface pre-treatment is roughening, for example, using etching techniques. Such techniques have advantage that they are relatively cheap.

It will be appreciated that techniques that are likely to use wells are printing and patterned photoresist. The techniques where there are substantially no physical wells are surface pre-treatment, coating and drying. In addition, application of patterned light to a photosensitive hole or electron injection layer material, followed by a washing step to remove material that was not affected by the applied light could be used to pattern the thickness of the hole or electron injection layer.

In a still further embodiment of the device according to the invention, the functional layer comprises a light-emitting layer superposed on a hole injection layer, thickness of the hole injection layer being modulated.

It is found that generation of light with different colours may be enabled by modulating thickness of any sub-layer forming the functional light-emitting layer of the OLED. For example, thickness of the hole injection layer, the light emitting layer, or an electron injection layer may be modulated as an alternative embodiment.

A device according to the invention, comprising a top-emissive OLED as is discussed with reference to the foregoing, may relate to a sensor, a display unit, a lighting arrangement or a signage unit.

It will be appreciated that OLEDs according to the present invention may be used in a great plurality of devices, wherein generation of light of different emission colours is desirable. For example, the OLEDs may be incorporated in a suitable polymer or molecular-based organic electronic device, for example a display or fluorescence spectrometer. Additionally, the OLEDs according to the invention may be used in a lighting device or in a signage unit.

In addition, the technique could be used in other applications in organic electronics where the variation in the thickness of one of the layers is required to be patterned and controlled in a simple way. Examples include OFETs and lasing and gain applications where tuning of the cavity is required.

A method of manufacturing a top-emissive organic light-emitting diode (OLED) arranged to emit light having different colours, comprises the steps of:
providing a first electrode layer on a substrate;
depositing a sub-layer of material forming a part of a light-emitting functional layer of the OLED;
allowing the material to interact with a thickness modifier for forming regions of different thickness in the said sub-layer of material;
depositing a second electrode layer on said functional layer.

For example, wherein the thickness modifier comprises a pre-shaped heater plate, the method may comprise the step of:
heating the layer of material with the pre-shaped heater plate for forming regions with a modified thickness in the layer of material in areas spatially superposing the pre-shaped heater plate.

Alternatively, when the thickness modifier comprises a layer provided with a plurality of wells having different lateral dimensions, the method may further comprise the step of filling the wells by the material forming a part of a light-emitting functional layer of the OLED. In this way a modulated thickness for the layer of material forming a part of a light-emitting functional layer of the OLED can be achieved.

It will be appreciated that the method of invention may comprise the step of depositing further layers of the diode. In particular, when the functional layer comprises a plurality of layers, like the light-emitting layer superposed on the hole injection layer or the electron injection layer, the method according to the invention comprises the step of depositing the light emitting layer in addition to said hole injection layer and/or said electron injection layer.

In an embodiment of the method according to the invention the first electrode layer and/or the second electrode may be reflective or partially reflective. Alternatively, for the substrate a metal foil or a reflective material provided on a glass or plastic foil may be used. In further embodiments of the method according to the invention the material with its thickness modulated is an electron injection layer, or an optically (semi) transparent spacer layer above the metal electrode layer and below the optically (semi) transparent hole or electron injection layer. It will be appreciated that the (semi) transparent layer has transparency of at least 50% to visible light.

In the method of the invention the layer of material with a patterned layer thickness may be provided using a thickness modulator produced by lithography, or by printing, coating, drying or surface pre-treatment. It will be appreciated that the method according to the invention wherein colour modulation is achieved by modulating local thickness of a sub-layer of the light emitting functional layer may also be applied during manufacturing of Field Effect Transistors (FET).

These and other aspects of the invention will be discussed in more detail with reference to drawings, wherein like reference numerals refer to like elements. It will be appreciated that the drawings are presented for illustrative purposes and may not be used for limiting the scope of the appended claims.

BRIEF DESCRIPTION OF THE DRAWINGS

FIG. 1b presents schematically a top view of the structure of FIG. 1a.

DETAILED DESCRIPTION OF THE DRAWINGS

Figure 1A:
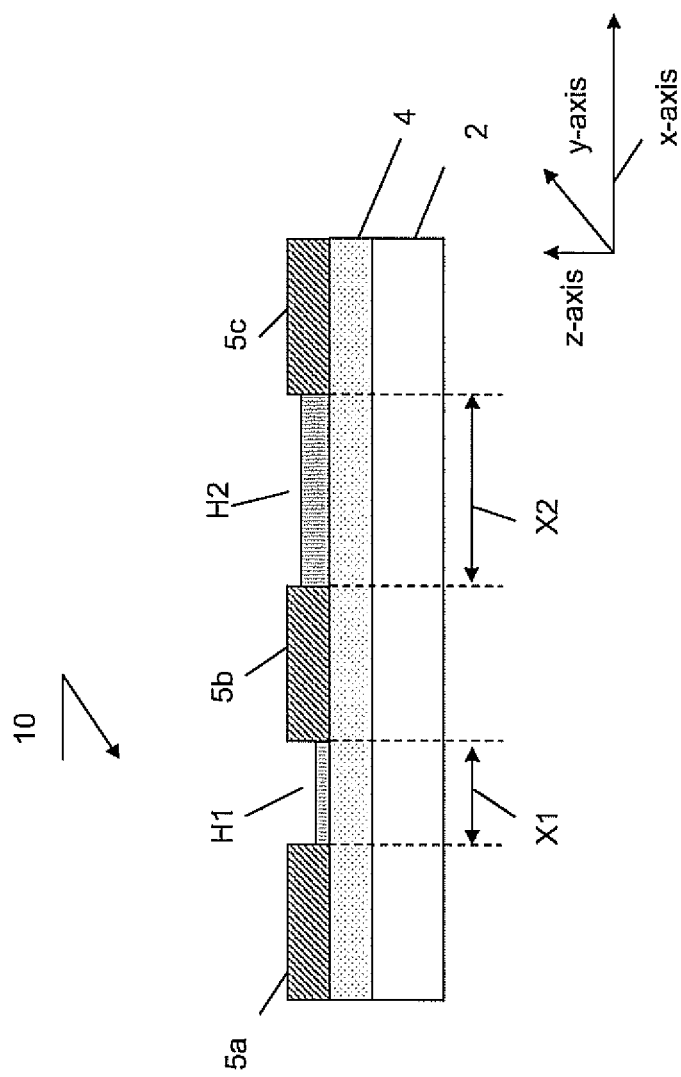
FIG. 1a presents in a schematic way an embodiment of a cross-section of an OLED according to the invention.

FIG. 1a presents in a schematic way an embodiment of a cross-section of an OLED according to the invention. An OLED 10 in this embodiment relates to a top-emissive OLED, comprising a layer of a reflective electrode, for example an anode 4 arranged on a suitable substrate 2. On top of the anode layer a layer comprising elements 5a, 5b, 5c are provided which will later result in a thickness modulation pattern of the functional layers. Preferably, the elements 5a, 5b and 5c relate to photoresist, which is pre-patterned using photolithographic methods. In accordance with the invention a sub layer of the functional layer, for example, a hole injecting layer, is modulated yielding regions H1, H2 of different respective thickness. Such thickness modulation is obtained by utilizing a per se known effect, wherein a level of well filling with a liquid material is determined by the lateral dimensions of the well, for example by a dimension X1, X2 along an x-axis of the substrate. It is found that this effect provides a reliable and reproducible means of modulation of the thickness a functional layer, which in turn results in an accurate and reliable modulation of resulting colour of emitted light through a micro cavity effect.

It will be appreciated that a relation between a well dimension, like a lateral dimension along an axis or the cross-sectional area, and a resulting well filling by a given material, such as a material used as a hole injection layer (for example PEDOT:PSS or PANI), a suitable light-emitting polymer (LEP), or a suitable material for the electron injection layer may be determined before-hand either theoretically or empirically.

Figure 1B:
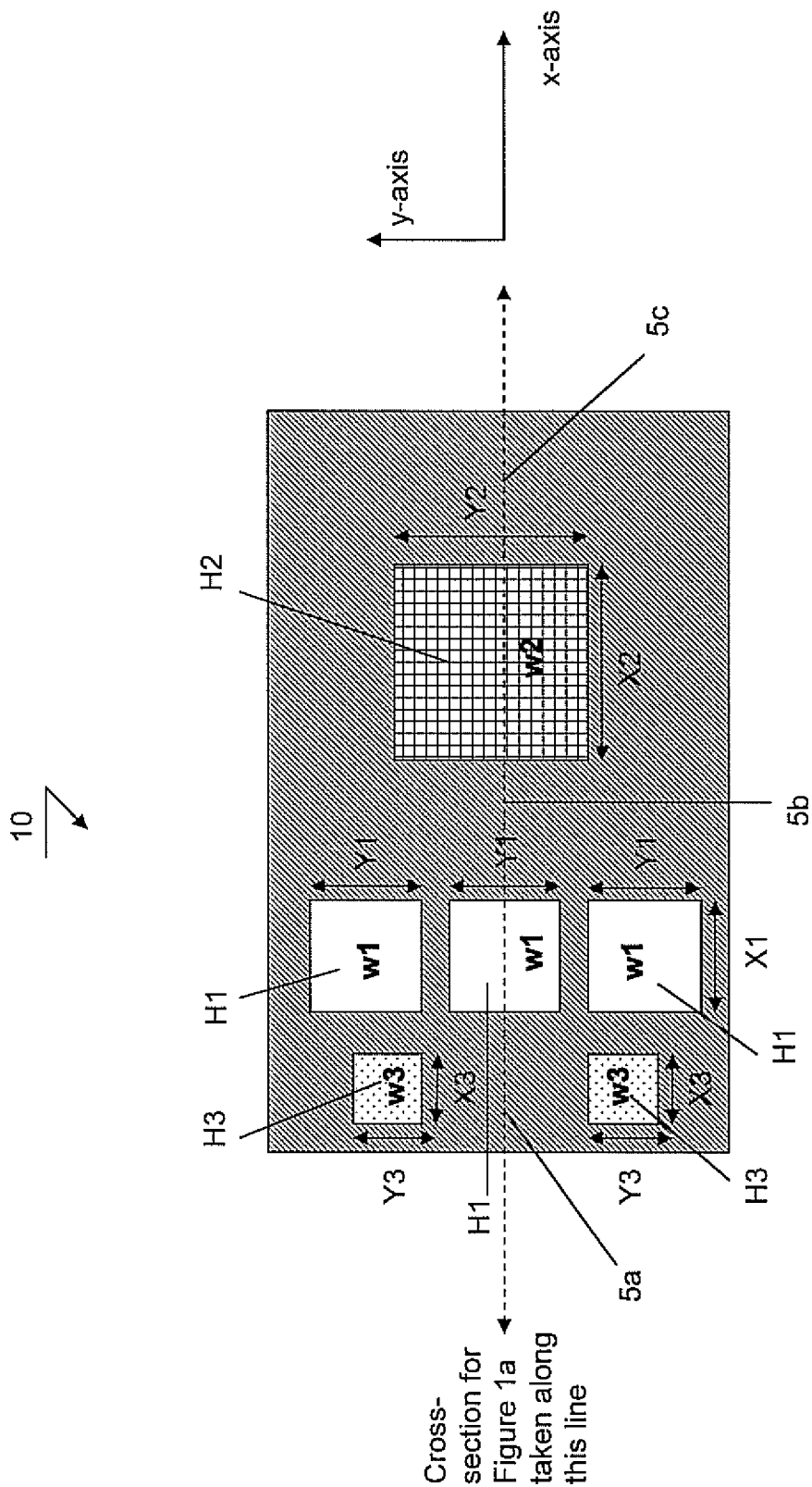

FIG. 1b presents schematically a top view of the structure of FIG. 1a. It will be appreciated that this top view is given in exaggerated proportions for clarity purposes. In accordance with an aspect of the invention, the thickness of a layer constituting a functional light-emitting layer of the top-emissive OLED is modulated using a plurality of wells formed, for example, between bank structures viewed in FIG. 1a as 5a, 5b, 5c, etc. The lateral dimensions along the x-axis and y-axis of the wells w1, w2, w3, etc., determine the resulting thicknesses H1, H2, H3, etc of a layer deposited directly onto the wells. Accordingly, desired simple and reproducible thickness modulation of a portion of a functional layer is achieved.

For example, the wells w1, w2, w3, etc., may be formed using a photolithography mask producing a resist layer containing the wells with dimensions from 240×240 $\mu m^2$ to 40×40 $\mu m^2$. Using such a mask it may be possible to produce an OLED where the emission colour varies from green to blue in relation to the lateral dimensions of the well in the photoresist layer when a PEDOT layer and a normally blue-emitting polymer layer are deposited, for example, by spin coating over the surface of the photoresist layer having the wells w1, w2, w3.

It is found that the OLED according to the invention has the following advantages. A common technique to locally vary the emission colour for a particular hole injection layer and light-emitting layer is to use a layer of ITO below these and to locally vary the thickness of this ITO layer. However, a patterned ITO layer is an expensive additional processing step, and this brittle material is not ideal in flexible electronics applications. In the invention described here the emission colour modulation is obtained by modulating the thickness of a sub-layer forming a part of a functional layer of the OLED and therefore no brittle, expensive ITO layer is required. By fine tuning the thickness modulation a great plurality of emission colours is obtainable, which is explained in more detail with reference to FIG. 2. An alternative technique described by others is to locally vary the thickness of the light-emitting layer using a controlled ink jet printing process. The technique that we describe here is much more straightforward. The variation in hole injection, light-emitting or electron injection layer thicknesses is achieved in a fast, simple and cost effective way by coating one of each of the layers over the entire patterned substrate using a large area coating technique such as slot-die coating. It is possible to achieve many colours from only one light-emitting material (especially if a normally white-emitting material is used) without having to use separate red, green and blue emitters. Next, when photolithography is used for patterning the wells, it is likely that there are no additional production costs as a photoresist layer may be used for defining the pixel pattern anyway, even for a monochromatic signage application. In addition, the resolution of the colour variation across the OLED is determined by photolithography on the photoresist, which is known for its ability to enable high quality patterning. Other techniques to vary the thickness of any of the sub-layers of the functional layer such as drying or surface pre-treatment should also be simple and cost effective.

Figure 2:
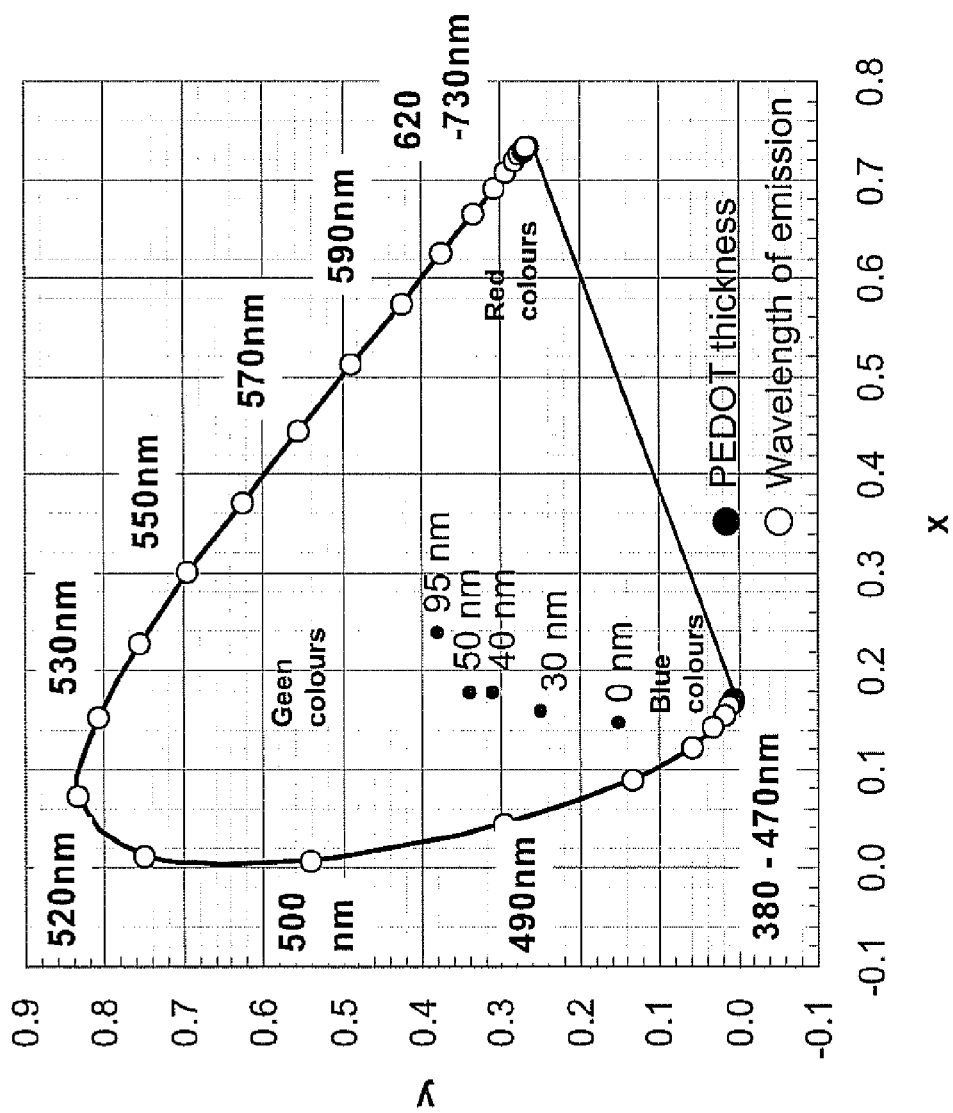
FIG. 2 presents the CIE colour coordinates for the emission obtainable from a top-emissive OLED when the thickness of the PEDOT functional layer is modulated, and the thickness of the normally blue-emitting light-emitting layer is kept the same.

FIG. 2 presents the CIE colour coordinates for the emission obtainable from a top-emissive OLED when the thickness of the PEDOT functional layer is modulated, and the thickness of a normally blue-emitting light-emitting layer on top of this is kept the same. A CIE plot is a way to represent all colours visible to the human eye in a quantitative way. All colours that can be seen fall with in the bell shaped region marked on the diagram by the solid black line, and each colour therefore has x and y coordinates which can be read off from the axes of the graph. Colours that correspond to a single wavelength of emission fall exactly on the black line and some of these specific wavelengths are marked in FIG. 2 by white circles with the corresponding wavelength next to them. Colours that fall in the bottom left hand corner of the bell shape are blue, those in the top are green and those in the right hand corner are red. Near the centre of the bell shape at a position with coordinates (0.33, 0.33) is white. For top-emissive OLEDs made with different PEDOT layer thicknesses but the same, normally blue-emitting, light-emitting layer different emission colours are achieved. To show that the variation in emission colour is quite considerable, the colour coordinates for such devices are plotted on the CIE diagram as black circles with the corresponding PEDOT layer thickness next to them. It can be seen that varying the PEDOT layer thickness from 0 nm to 95 nm moves the emission from coordinates around (0.15, 0.15) corresponding to blue emission, to coordinates around (0.24, 0.38) corresponding to green emission. Thus, FIG. 2 gives an example of how the emission colour can be controlled by the thickness of the PEDOT layer within the functional layer. To determine the relationship between well dimensions and the colour a test pattern with different well sizes could to be made. As a result a suitable photolithographic mask or other patterning means can be designed in accordance with such relation for enabling accurate local generation of thickness modulation in a desired layer.

It will be appreciated that while specific embodiments of the invention have been described above, that the invention may be practiced otherwise than as described. In addition, isolated features discussed with reference to different figures may be combined.

The invention claimed is:

1. A top-emissive organic light-emitting diode (OLED) arranged to emit light having different emission colours, comprising a multi-layered structure provided with a first electrode, a second electrode and a functional layer capable of light emission disposed between the first electrode and the second electrode, wherein thickness of the functional layer is modulated by allowing at least a portion of the functional layer to interact with a thickness modulator, wherein the said portion of the functional layer comprises a hole injection layer or an electron injection layer, wherein the thickness modulator comprises a layer provided with a plurality of wells having different lateral dimensions directly beneath the functional layer and wherein thickness modulation of the functional layer is achieved by a different level of well filling for wells of different dimensions due to wetting properties.

2. A diode according to claim 1, wherein the thickness modulator comprises a heater arranged near the functional layer during manufacturing of the OLED.

3. A diode according to claim 2, wherein the plurality of wells is provided by a patterned photoresist.

4. A diode according to claim 1, wherein the thickness modulator of the functional layer is provided by a technique selectable from a group consisting of: surface pre-treatment, printing, coating and drying.

5. A diode according to claim 1, wherein the hole injection layer or the electron injection layer is photosensitive, wherein the thickness modulation is provided by application of a patterned light to the photosensitive hole or electron injection layer.

6. A diode according to claim 1, wherein the functional layer comprises a light-emitting layer superposed on a hole or electron injection layer which is arranged on top of an optically (semi) transparent spacer layer wherein thickness of the optically (semi) transparent spacer layer is modulated.

7. A diode according to claim 1, wherein functional layer comprises a light-emitting layer superposed on an electron injection layer or on a hole injection layer, wherein thickness of the light-emitting layer is modulated.

8. An electronic device comprising the diode according to claim 1.

9. A method of manufacturing a top-emissive organic light-emitting diode (OLED) arranged to emit light having different colours, the method comprising the steps of:
providing a first electrode layer on a substrate;
providing a thickness modulator comprising a layer provided with a plurality of wells having different lateral dimensions;
depositing a layer of material forming a part of a light-emitting functional layer of the OLED, wherein thickness modulation of the functional layer is achieved by a different level of well filling for wells of different dimensions due to wetting properties directly beneath the functional layer, and wherein for the functional layer a hole injection layer or an electron injection layer is selected; and
depositing a second electrode layer on said functional layer.

10. A method according to claim 9, wherein the thickness modifier comprises a pre-shaped heater plate, the method comprising the step of:
heating the layer of material with the pre-shaped heater plate for forming regions with modified thickness in the layer of material in areas spatially near the pre-shaped heater plate.

11. A method according to claim 9, wherein the first electrode layer and/or the second electrode are reflective or partially reflective.

12. A method according to claim 9, wherein for the substrate a metal foil or a reflective material provided on a glass or plastic foil is used.

* * * * *